(12) United States Patent
Chen et al.

(10) Patent No.: US 9,236,555 B2
(45) Date of Patent: Jan. 12, 2016

(54) PIEZOELECTRIC BASED MEMS STRUCTURE

(75) Inventors: Po-Jui Chen, Sunnyvale, CA (US); Ando Feyh, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 725 days.

(21) Appl. No.: 13/349,009

(22) Filed: Jan. 12, 2012

(65) Prior Publication Data

US 2013/0181575 A1 Jul. 18, 2013

(51) Int. Cl.
| | |
|---|---|
| *H01L 41/083* | (2006.01) |
| *H01L 41/09* | (2006.01) |
| *G01L 1/16* | (2006.01) |
| *H01L 41/047* | (2006.01) |
| *H01L 41/113* | (2006.01) |

(52) U.S. Cl.
CPC ............. *H01L 41/096* (2013.01); *G01L 1/16* (2013.01); *H01L 41/047* (2013.01); *H01L 41/094* (2013.01); *H01L 41/1132* (2013.01); *Y10T 29/42* (2015.01)

(58) Field of Classification Search
CPC ... H01L 41/083; H01L 41/09; H01L 41/0926; H01L 41/39
USPC .................................. 310/331, 332, 333, 366
See application file for complete search history.

(56) References Cited

U.S. PATENT DOCUMENTS

| | | | | |
|---|---|---|---|---|
| 5,975,668 | A * | 11/1999 | Fujii et al. ................ | 347/10 |
| 7,068,474 | B2 * | 6/2006 | Kuwajima ........... | G11B 5/5552 |
| | | | | 310/330 |
| 7,420,318 | B1 | 9/2008 | Pulskamp | |
| 7,710,003 | B2 * | 5/2010 | Shibata ................. | H01L 41/094 |
| | | | | 310/330 |
| 2006/0055287 | A1 * | 3/2006 | Kawakubo ............... | H01G 5/18 |
| | | | | 310/348 |
| 2007/0228887 | A1 * | 10/2007 | Nishigaki ............. | B81B 3/0072 |
| | | | | 310/332 |
| 2007/0281646 | A1 * | 12/2007 | Itaya ....................... | H01G 5/18 |
| | | | | 455/197.2 |
| 2008/0061916 | A1 * | 3/2008 | Pulskamp ............... | H01F 21/06 |
| | | | | 336/130 |

FOREIGN PATENT DOCUMENTS

| | | |
|---|---|---|
| EP | 0790481 A1 | 8/1997 |
| JP | S61170082 | 7/1986 |

OTHER PUBLICATIONS

International Search Report and Written Opinion in corresponding PCT application (i.e., PCT/US2013/021335), mailed May 27, 2013 (10 pages).
Trolier-McKinstry et al, "Thin Film Piezoelectrics for MEMS", Journal of Electroceramics, 2004, pp. 7-17. vol. 12, © 2004 Kluwer Academic Publishers, The Netherlands (11 pages).

* cited by examiner

*Primary Examiner* — Shawki S Ismail
*Assistant Examiner* — Bryan Gordon
(74) *Attorney, Agent, or Firm* — Maginot Moore & Beck LLP

(57) ABSTRACT

In one embodiment, a method of deforming a MEMS structure includes providing a base layer, providing a first piezoelectric slab operably connected to a surface of the base layer, determining a desired deformation of the base layer, applying a first potential to a first electrode operably connected to the first piezoelectric slab, applying a second potential to a second electrode operably connected to the first piezoelectric slab, and deforming the base layer with the first piezoelectric slab using the applied first potential and the applied second potential based upon the determined desired deformation.

10 Claims, 4 Drawing Sheets

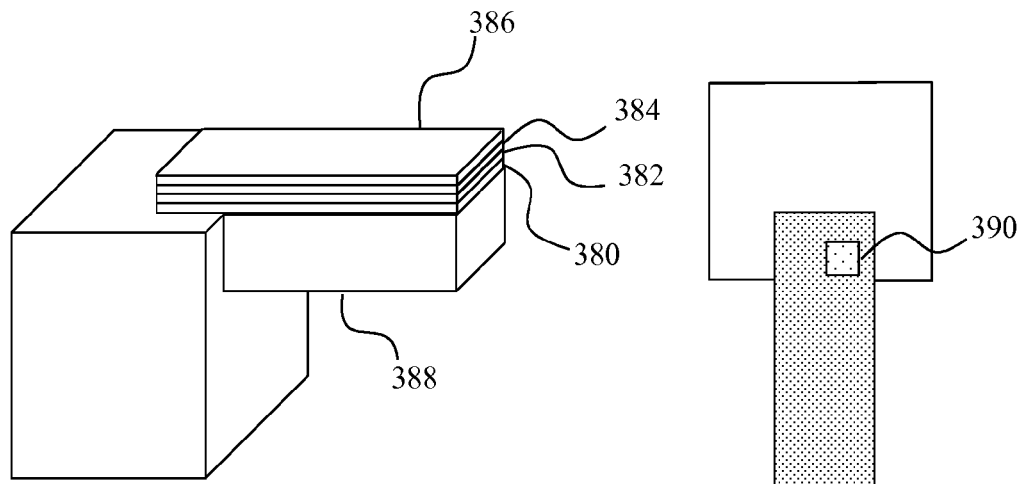
FIG. 16
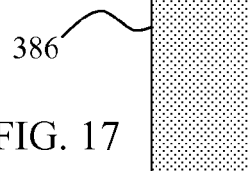
FIG. 17
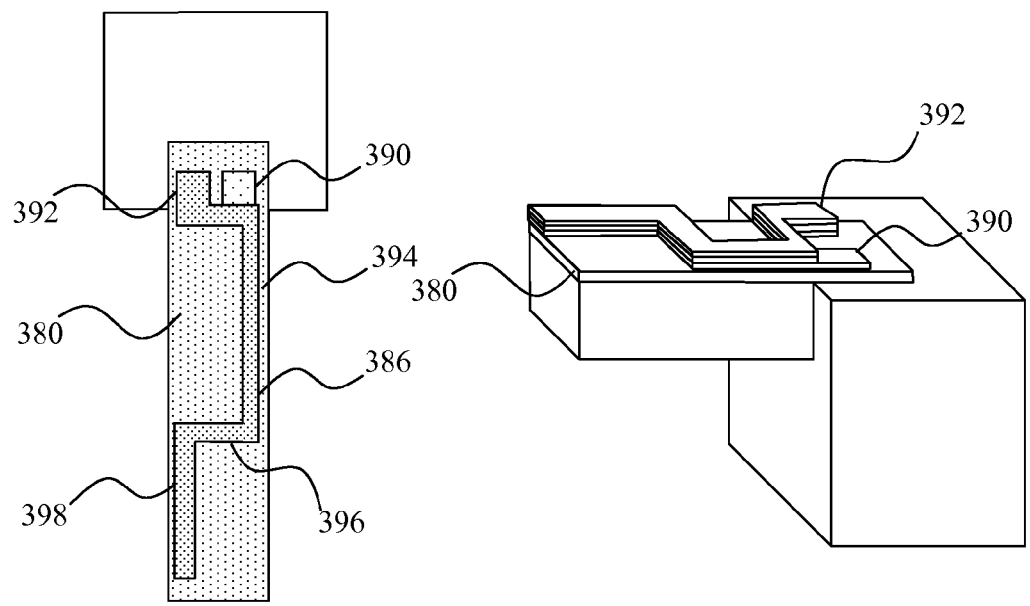
FIG. 18
FIG. 19

US 9,236,555 B2

PIEZOELECTRIC BASED MEMS STRUCTURE

FIELD OF THE INVENTION

This invention relates to structures and substrates such as are used in micromechanical electrical system (MEMS) devices or semiconductor devices.

BACKGROUND

MEMS devices frequently operate based upon reactions to applied forces, pressures, and loads. In many systems, the manner in which a membrane or structure is deformed or deflected is used as a sensing or actuating function. Such deformation includes expansion and contraction, longitudinal bending, transversal bending, and torsional bending. Specific structural deformation is required in some specialized devices. For example, in Coriolis-effect-based MEMS vibratory gyroscopes incorporating a vibrating-plate topology concept, translational motion of a proof mass in drive direction is relied upon to provide accurate sensing functions. Any motion of the proof mass that is not purely within the drive direction can affect the accuracy of the device.

In many devices which incorporate a proof mass, movement of the proof mass is detected using electrostatic forces induced by capacitive comb drives or parallel plates and applied to either the proof mass or the proof mass frame, depending upon the particular device design. Movement of the proof mass along the drive direction is then sensed or effected while the proof mass is supported by a mechanical support such as a beam. Both comb drive and parallel plate designs are subject to various limitations. Comb drives, for example, are susceptible to high actuation voltage and microfabrication process complexity while parallel plates are susceptible to high actuation voltage, non-linearity over travel distances, and pull-in effect. Accordingly, design flexibility and performance of these types of devices can be limited. Additionally, these devices typically exhibit decreasing performance as the size of the devices is further miniaturized.

What is needed therefore is a system and method of forming a system that can accomplish and/or sense microstructure deflection which is simple to manufacture. It would be beneficial if the system and method of forming a system could be accomplished using known MEMS manufacturing processes. It would be further beneficial if the system and method of forming a system could be easily adapted to smaller platforms.

SUMMARY

In one embodiment, a method of deforming a MEMS structure includes providing a base layer, providing a first piezoelectric slab operably connected to a surface of the base layer, determining a desired deformation of the base layer, applying a first potential to a first electrode operably connected to the first piezoelectric slab, applying a second potential to a second electrode operably connected to the first piezoelectric slab, and deforming the base layer with the first piezoelectric slab using the applied first potential and the applied second potential based upon the determined desired deformation.

In a further embodiment, a MEMS device includes a base layer, a first piezoelectric layer portion operably connected to a surface of the base layer, a first conducting portion positioned adjacent to a first side of the first piezoelectric layer portion, a second conducting portion positioned adjacent to a second side of the first piezoelectric layer portion, wherein the first side is opposite to the second side and the first and second conducting portions are positioned so as to apply a first electric field to the first piezoelectric slab, and a voltage source operably connected to the first and the second conducting portions and configured to apply a desired potential across the first and the second conducting portions such that the first piezoelectric layer portion causes the base layer to deform based upon a desired deformation.

In yet another embodiment, a MEMS device includes a base layer extending outwardly from a base portion, a first piezoelectric layer portion operably connected to a surface of the base layer, a first conducting portion positioned adjacent to a first side of the first piezoelectric layer portion and between the first piezoelectric layer portion and the base layer, a second conducting portion positioned adjacent to a second side of the first piezoelectric layer portion, a second piezoelectric layer portion spaced apart from the first piezoelectric layer portion and operably connected to the surface of the base layer, a third conducting portion in electrical communication with the second conducting portion and positioned adjacent to a third side of the second piezoelectric layer portion and between the second piezoelectric layer portion and the base layer, and a fourth conducting portion positioned adjacent to a fourth side of the second piezoelectric layer portion.

BRIEF DESCRIPTION OF THE DRAWINGS

FIGS. 16-18 depict a procedure which can be used to form piezoelectric slabs and conducting portions on a structure which provide substantially the same functionality as the piezoelectric slabs and conducting portions formed in FIGS. 13-15 while using a less complex manufacturing process; and FIG. 19 depicts a MEMS device formed using the procedure of FIGS. 16-18.

DESCRIPTION

Figure 1:
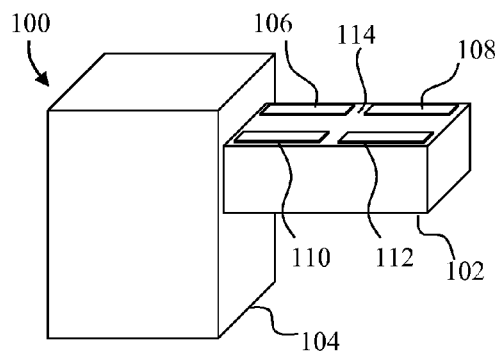
FIG. 1 depicts a partial perspective view of a MEMS device incorporating piezoelectric slabs on a base layer to provide controlled deformation and/or sensing of deformation of the base layer in accordance with principles of the invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Figure 2:
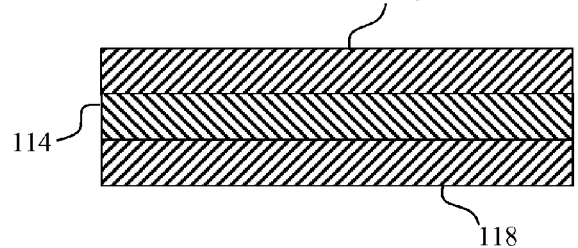
FIG. 2 depicts a cross sectional view of a piezoelectric slab of FIG. 1.

FIG. 1 is a simplified depiction of a portion of a MEMS device 100. The MEMS device 100 includes a base layer 102 extending from an anchor 104. While in the embodiment of FIG. 1 the base layer 102 is depicted as a support beam, a base layer in other embodiments may be a beam, a lever arm, a membrane, or any other desired substrate. The anchor 104 may comprise silicon or another structural material. Four piezoelectric slabs 106, 108, 110, and 112 are located on an upper surface 114 of the base layer 102. The piezoelectric slabs 106, 108, 110, and 112 are similar, with each including a piezoelectric layer 114 sandwiched between two electrodes 116/118 as depicted in FIG. 2. In other embodiments, the electrodes may be spaced apart from the piezoelectric layer 114 and may even be separate from the MEMS device 100.

The piezoelectric layer 114 in the piezoelectric slabs 106, 108, 110, and 112 may include aluminum nitride (AlN), zinc oxide (ZnO), lead zirconate titanate (PZT), or any desired piezoelectric material. The crystallography of the piezoelectric layer 114 in the piezoelectric slabs 106, 108, 110, and 112 is selected so as to induce a desired stress on the base layer 102 in the presence of one or more electric fields as discussed with further reference to FIG. 3.

Figure 3:
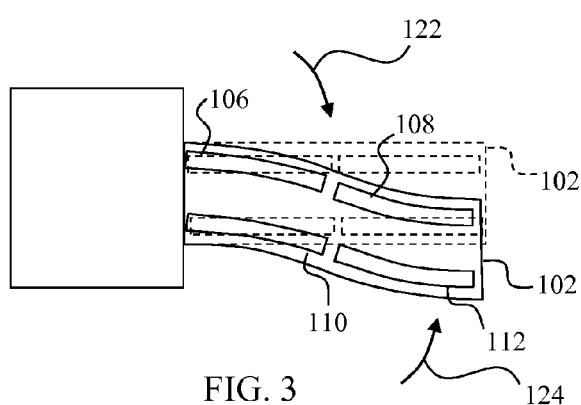
FIG. 3 depicts a partial top plan view of the MEMS device of FIG. 1 wherein axially aligned piezoelectric slabs on opposite edges of a base layer surface can be controlled to provide a desired in-plane movement of the base layer or used to sense in-plane movement of the base layer.

FIG. 3 depicts the MEMS device 100 in the presence of electric fields (not shown) generated using the electrodes 116 and 118 in each of the piezoelectric slabs 106, 108, 110, and 112. In the presence of the electric fields, the piezoelectric slabs 106 and 112 are configured to apply a tensile force to the upper surface 114 of the base layer 102 while the piezoelectric slabs 108 and 110 are configured to apply a compressive force to the upper surface 114 of the base layer 102.

Because the left side of the base layer 102 as depicted in FIG. 2 is supported by the anchor 104, application of the tensile force by the piezoelectric slab 106 and the compressive force by the piezoelectric slab 110 results in controlled deformation of the base layer 102 immediately below the piezoelectric slabs 106/110 in the direction of the arrow 122. At the same time, the tensile force by the piezoelectric slab 112 and the compressive force by the piezoelectric slab 108 results in controlled deformation of the base layer 102 immediately below the piezoelectric slabs 108/112 in the direction of the arrow 124.

The above described deformation of the base layer 102 results in an in-plane offset of the extreme right-hand portion of the base layer 102. Accordingly, by varying the strength of the electric field applied to the piezoelectric slabs 106/108/110/112, the offset of the extreme right-hand portion of the base layer 102 can be controlled to a desired location. This allows for "tuning" of the position of, for example, a proof mass attached to the extreme right-hand portion of the layer 102.

The different forces applied by the piezoelectric slabs 106/108/110/112 may be accomplished by providing the piezoelectric slabs 106 and 112 with a crystallography that is different from the crystallography of the piezoelectric slabs 108 and 110 in order to obtain different responses from a uniform electric field. Alternatively, the orientation of the electrodes 116/118 may be modified to provide for one electronic field orientation for the piezoelectric slabs 106 and 112 and a different electronic field orientation for the piezoelectric slabs 108 and 110.

Figure 4:
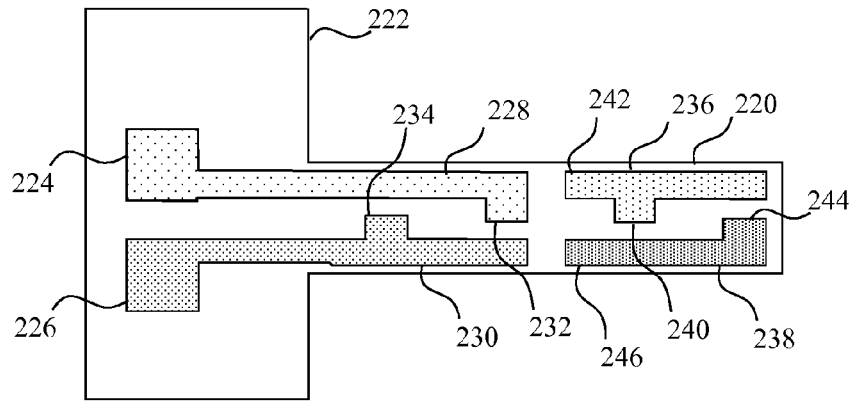
FIGS. 4-6 depict a procedure which can be used to form piezoelectric slabs using a single deposition for all of the piezoelectric slabs while forming and connecting conducting portions to modify the electric field applied to the piezoelectric slabs to produce a desired deformation of a base layer like the deformation of the base layer in FIG. 3.
Figure 5:
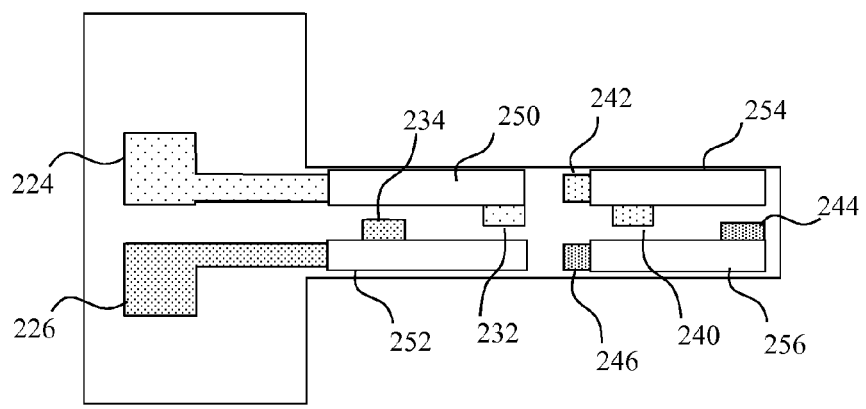
Figure 6:
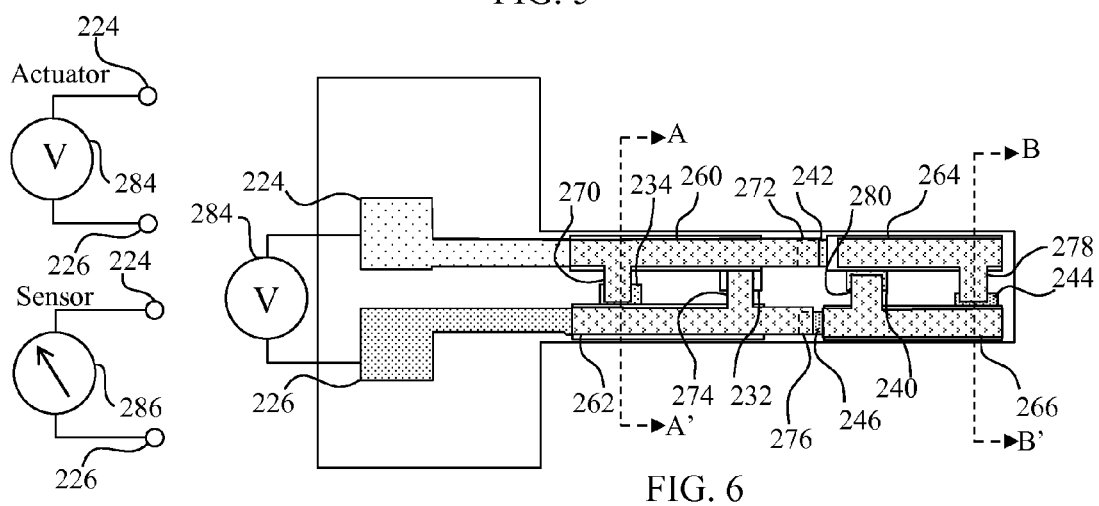

By way of example, FIGS. 4-6 depict a process of forming integral electrodes with a modified electric field such that even if the layout of piezoelectric slabs is the same as in FIG. 1, a single crystallography can be used to obtain movement like that depicted in FIG. 3. FIG. 4 depicts a base layer 220 that is integrally formed with an anchor portion 222. While not shown in FIG. 4, additional structure, such as a proof mass, may be attached to the base layer 220 either before or after the portion of the fabrication process depicted in FIGS. 4-6. The additional structure may be connected to the right side of the base layer 220 or to any other desired side of the base layer 220.

FIG. 4 further depicts electrodes 224 and 226 which are formed on the anchor portion 222 and which are in electrical communication with conducting portions 228 and 230, respectively. Different shadings are provided for the various components in FIGS. 4-6. This shading is used only for purpose of distinguishing the different components and is not intended to indicate type of materials used. The conducting portions 228 and 230 are located on the base layer 220. The conducting portion 228 includes a connection member 232 while the conducting portion 230 includes a connection member 234. Two additional conducting portions 236 and 238 are spaced apart from and axially aligned with the conducting portions 228 and 230. The conducting portion 236 includes connection members 240 and 242 while the conducting portion 238 includes connection members 244 and 246. If desired, an insulating layer may be formed on the anchor 222 and or the base layer 220. In the embodiment of FIGS. 4-6, the anchor 222 and the base layer 220 are formed from a nonconductive material. Accordingly, an insulating layer is not needed.

Advantageously, the electrodes 224 and 226, the connection portions 232, 234, 228, 230, 240, 242, 244, and 246, and the conducting portions 228, 230, 236, and 238 may be formed using any desired microfabrication process or processes such as standard deposition, lithography, and etching processes. Accordingly, these components, along with other components described with reference to FIGS. 4-6, can be formed at any desired point of a process used to form microstructures or topology for a MEMS device. For example in embodiments wherein the base layer 220 functions as a lever arm, the base layer 220 may be released from an underlying substrate before or after deposition of the electrodes 224 and 226, the connection portions 232,234, 228, 230, 240, 242, 244, and 246, and the conducting portions 228, 230, 236, and 238.

Once the electrodes 224 and 226 and the conducting portions 228, 230, 236, and 238 are formed, piezoelectric portions 250, 252, 254 and 256 are formed above the conducting portions 228, 230, 236, and 238, respectively, as depicted in FIG. 5. The piezoelectric layer portions 250 and 254 are axially aligned and the piezoelectric layer portions 252 and 256 are axially aligned. When each of the piezoelectric layer portions 250, 252, 254 and 256 are formed during the same deposition process, as in this embodiment, they will each have identical crystallography. The piezoelectric portions 250, 252, 254 and 256 are not formed above the connection member(s) 232, 234, 240, 242, 244, and 246 associated with the respective conducting portions 228, 230, 236, and 238.

Next, conducting portions 260, 262, 264, and 266 are formed as shown in FIG. 6. The conducting portions 260, 262, 264, and 266 are substantially positioned over the conducting portions 228, 230, 236, and 238, respectively. The conducting portion 260 includes a connection portion 270 that is operably connected to the connection portion 234 of the conduction portion 230. The conducting portion 260 further includes a connection portion 272 that is operably connected to the connecting portion 242 of the conducting portion 236.

The conducting portion 262 includes a connection portion 274 that is operably connected to the connection portion 232 of the conduction portion 228. The conducting portion 262 further includes a connection portion 276 that is operably connected to the connecting portion 246 of the conducting portion 238.

Each of the conducting portions 264 and 266 has only a single connection portion 278 and 280, respectively. The connection portion 278 is operably connected to the connection portion 244 of the conducting portion 238 while the connection portion 280 is operably connected to the connection portion 240 of the conducting portion 236.

If additional structural modification is desired, additional microfabrication may be performed to add, remove, or modify structure depending upon the particular application. Additionally, while the above described processes include deposition of various layers of material onto a base layer and then definition of the components of the piezoelectric slab, in some embodiments definition of structure in the base layer is provided after the piezoelectric slab components have been formed. The actual sequencing will vary depending upon the particular process flow selected.

Figures 7, 8:
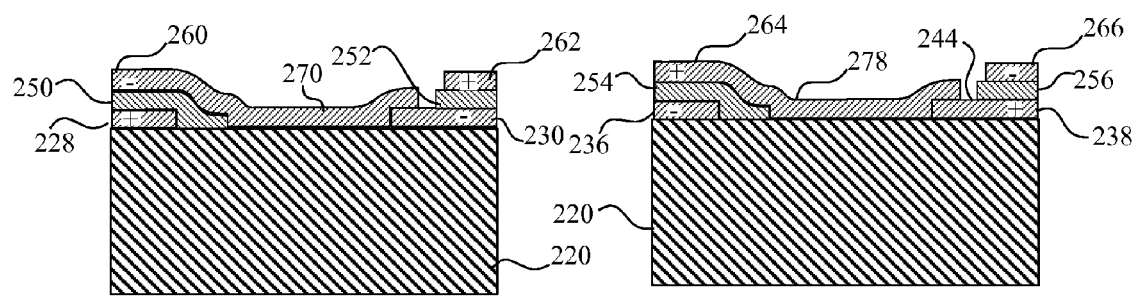
FIG. 7 depicts a cross-sectional view of the base layer of FIG. 6 taken along the line A-A' showing the electric field applied to the piezoelectric slabs closest to the anchor portion of the device of FIG. 6.
FIG. 8 depicts a cross-sectional view of the base layer of FIG. 6 taken along the line B-B' showing the electric field applied to the piezoelectric slabs farthest from the anchor portion of the device of FIG. 6.

Once completed, the base layer 220 may be deformed as desired by application of an electric potential across the electrodes 224 and 226 with the voltage source 284 as discussed with additional reference to FIGS. 7 and 8.

In this example, a positive potential applied to the electrode 224 by the voltage source 284 is transferred to the conducting portion 228 (FIG. 7). The piezoelectric portion 250 acts as an insulator, so no charge is passed to the conducting portion 260 (FIG. 7). The connection portion 232, however, is operably connected to the connection portion 274. Accordingly, the positive charge is applied to the conducting portion 262 (FIG. 7). The piezoelectric portion 252 acts as an insulator, so no charge is passed to the conducting portion 230. The connection portion 276, however, is operably connected to the connection portion 246 (FIG. 6). Accordingly, the positive charge is applied to the conducting portion 238 through the connection portion 246. The piezoelectric portion 256 acts as an insulator, so no charge is passed to the conducting portion 266 (FIG. 8). The connection portion 244, however, is operably connected to the connection portion 278. Accordingly, the positive charge is applied to the conducting portion 264 (FIG. 8).

Similarly, a negative potential applied to the electrode 226 is transferred to the conducting portion 230 (FIG. 4). The piezoelectric slab 252 acts as an insulator, so no charge is passed to the conducting portion 262 (FIG. 7). The connection portion 234, however, is operably connected to the connection portion 270 (FIG. 6). Accordingly, the negative charge is applied to the conducting portion 260 (FIG. 7). The piezoelectric portion 250 acts as an insulator, so no charge is passed to the conducting portion 228. The connection portion 272, however, is operably connected to the connection portion 242 (FIG. 6). Accordingly, the negative charge is applied to the conducting portion 236. The piezoelectric portion 254 acts as an insulator, so no charge is passed to the conducting portion 264 (FIG. 8). The connection portion 240, however, is operably connected to the connection portion 280 (FIG. 6). Accordingly, the negative charge is applied to the conducting portion 266 (FIG. 8).

The electric field established by application of a potential across the electrodes 224 and 226 is thus controlled such that a positive potential is effected above the piezoelectric portion 252 (FIG. 7) and 254 (FIG. 8) while a negative potential is effected above the piezoelectric portion 250 (FIG. 7) and 256 (FIG. 8). The resulting stress applied to the base layer 220 by the piezoelectric portions 250, 252, 254, and 256 generates a deformation like the deformation of the base layer 102 in FIG. 3. By variation of the potential across the electrodes 224 and 226, the amount of deformation of the base layer 220 can be controlled to achieve a desired in-plane deformation using piezoelectric slabs with identical crystallography. In forming a device incorporating connection portions which extend between upper and lower conducting portions of adjacent piezoelectric slabs, the piezoelectric slab which acts as an insulation layer between its associated electrodes can be larger than the underlying electrode to preclude shorting between the associated electrodes.

The configuration of FIG. 6 may also be used to detect mechanical stress applied to the base layer 220 by replacing or augmenting the voltage source 284 with a charge sensor 286. As the base layer 220 is deformed by a mechanical force applied to the base layer 220, the resulting deformation affects the voltage at the electrodes 224 and 226 because of the piezoelectric effect.

Moreover, ambient electric fields may be sensed using the configuration of FIG. 6, with or without application of an in-plane deformation. When configured as an electric field sensor, an ambient electric field applied to the piezoelectric layer portions 250, 252, 254, and 256 will result in modified compressive/tensile force to be applied by the piezoelectric layer portions 250, 252, 254, and 256 resulting in modified deformation of the base layer 220. The changed deformation may be sensed using, for example, capacitive sensing of a mass supported by the base layer 220.

The relationship between the forces involved in the MEMS device 100 which allow for the device 100 to be used as an actuator or a sensor with in-plane deformation is reflected in the following formula:

$$\delta_y = \left(\frac{3d_{31}E_{A1N}w_{A1N}w'L_b^2}{E_b t_b w_b^3}\right)V$$

wherein $w' = w_b - 2s - w_{A1N}$;

$\delta_y$ is the in-plane structure/beam end deformation;

V is the applied (actuator) or detected (sensor) electric voltage across the piezoelectric slab;

$d_{31}$ is the piezoelectric coefficient;

$E_{A1N}$ is the Young's modulus of the piezoelectric material;

$E_b$ is the Young's modulus of the beam material;

$w_{A1N}$ is the width of the piezoelectric slab;

$w_b$ is the width of the beam;

$t_b$ is the thickness of the beam;

$L_b$ is the length of the beam; and s is the separation between the beam edge and the piezoelectric slab edge.

Figure 9:
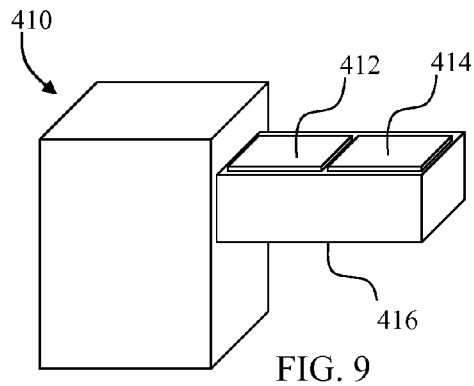
FIG. 9 depicts a partial perspective view of a MEMS device incorporating axially aligned piezoelectric slabs which occupy substantially all of the upper surface of a base layer which can be controlled to provide a desired out-of-plane movement of the base layer or used to sense out-of-plane movement of the base layer.
Figure 10:
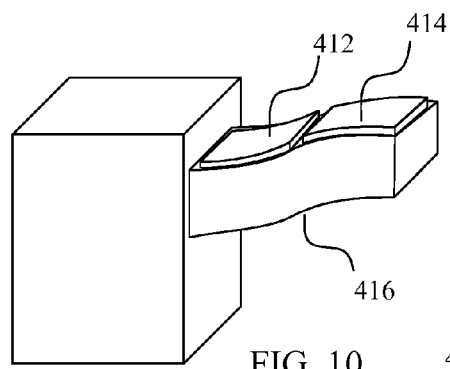
FIG. 10 depicts a partial perspective view of the MEMS device of FIG. 9 with the base layer deformed to an out-of-plane position.

In addition to in-plane deformation, piezoelectric slabs may be controlled to provide out-of-plane deformation or to sense out-of-plane mechanical forces. By way of example, FIG. 9 depicts a device 410 which includes two piezoelectric slabs 412 and 414 which are used to deform a base layer 416 (or to sense deformation of the base layer 416). When an electric field is applied to the piezoelectric slabs 412 and 414, the piezoelectric slab 412 is configured to apply a compressive force to the base layer 416 while the piezoelectric slab 414 is configured to apply a tensile force moving the base layer 416 in an out-of-plane direction to the configuration of FIG. 10. By reversing the electric field, or by reversing the crystallography of the piezoelectric slabs 412 and 414, a downward deformation may be realized.

Figure 11:
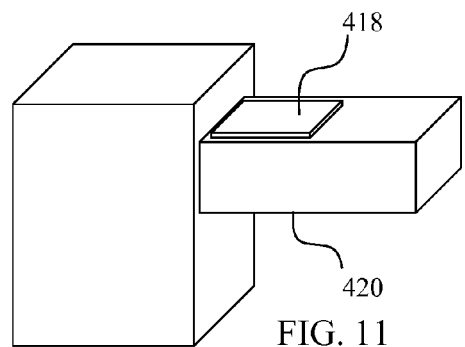
FIG. 11 depicts a partial perspective view of a MEMS device incorporating a single piezoelectric slab which extends from one edge of a surface of a base layer to the opposite edge of the surface of the base layer which can be controlled to provide a desired movement of the base layer or used to sense out-of-plane movement of the base layer.

While in the embodiment of FIG. 9 the piezoelectric slabs 412 and 414 cover substantially the entire upper surface of the base layer 416, a single piezoelectric slab may suffice for a particular application. In the embodiment of FIG. 11, a single piezoelectric slab 418 is used to deform, or sense the deformation of, a base layer 420.

Figure 12:
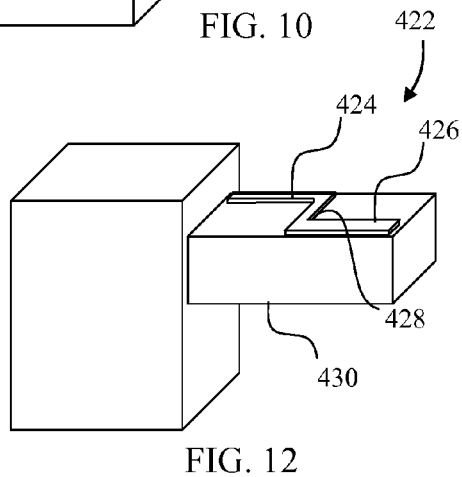
FIG. 12 depicts a partial perspective view of a MEMS device incorporating axially offset piezoelectric slabs on opposite edges of a base layer surface which can be controlled to provide a desired in-plane movement of the base layer or to sense in-plane movement of the base layer.

The relationship between the forces involved in the MEMS device 410 which allow for the device 410 to be used as an actuator or a sensor with out-of-plane deformation is reflected in the following formula:

$$\delta_z = \left(\frac{3d_{31}E_{A1N}w_{A1N}L_b^2}{2E_b w_b t_b^2}\right)V$$

wherein $\delta_z$ is the out-of-plane structure/beam end deformation;

V is the applied (actuator) or detected (sensor) electric voltage across the piezoelectric slab;

$d_{31}$ is the piezoelectric coefficient;

$E_{A1N}$ is the Young's modulus of the piezoelectric material;

$E_b$ is the Young's modulus of the beam material;

$w_{A1N}$ is the width of the piezoelectric slab;

$w_b$ is the width of the beam;

$t_b$ is the thickness of the beam; and $L_b$ is the length of the beam;

Typically, maximum effects may be obtained by placement of piezoelectric slabs adjacent to an edge of the base layer that is to be deformed for in-plane applications. In applications where lesser amount of deformation are required, it may not be necessary to use arrangements of axially aligned piezoelectric slabs as described above with reference to FIGS. 1 and 6. In such embodiments, offset piezoelectric slabs may be used. For example, a single slab 422 as depicted in FIG. 12 may be used. The piezoelectric slab 422 includes a two outer actuating/sensing portions 424 and 426. A connecting portion 428 is used to provide electrical connectivity between the axially offset actuating/sensing portions 424 and 426. By positioning the connecting portion 428 along the midline, movement of the underlying slab 430 is not adversely affected.

Figure 14:
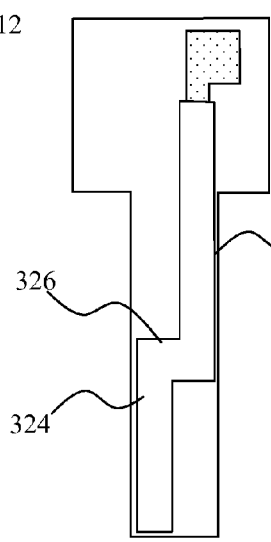
Figure 15:
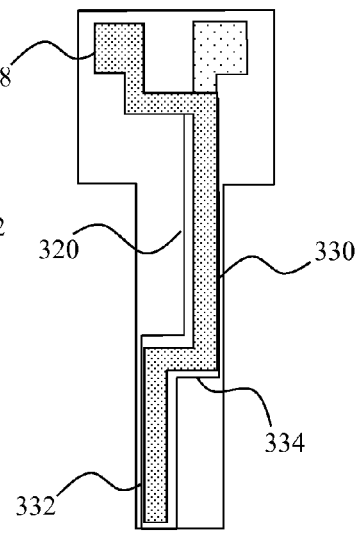

Offset piezoelectric slabs may be constructed in a MEMS device with integrally formed electrodes in a manner similar to the construction approaches described above. Thus, when both offset piezoelectric slabs are to be used to apply the same type of force, e.g., compressive or tensile, to a base layer, a process as depicted in FIGS. 13-15 may be used.

Figure 13:
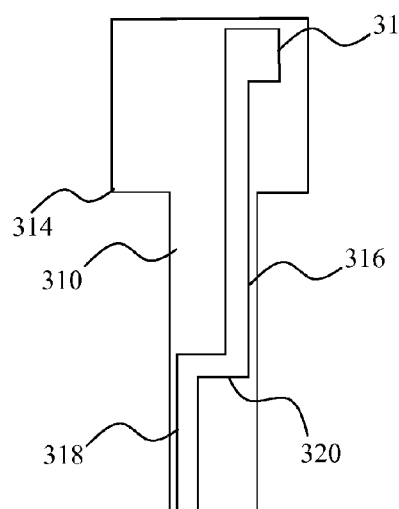
FIGS. 13-15 depict a procedure which can be used to form piezoelectric slabs using a single deposition for all of the piezoelectric layers while forming and connecting conducting portions to modify the electric field applied to the piezoelectric layers to produce a desired deformation of a base layer.

In FIG. 13, a base layer 310 is provided and an electrode 312 is formed on an anchor portion 314. The electrode 312 is operably connected to a conducting portion 316 which is in turn operably connected to a conducting portion 318 through a connection portion 320. Next, piezoelectric layer portions 322 and 324 are formed above the conducting portions 316 and 318 as depicted in FIG. 14. A piezoelectric portion 326 connects the conducting portions 316 and 318. The second electrode 328, along with conducting portions 330 and 332 which are connected by a connection portion 334, is then formed resulting in the configuration of FIG. 15.

While the above described processes include deposition of various layers of material onto a base layer and then definition of the components of the piezoelectric slab, in some embodiments definition of structure in the base layer is provided after the piezoelectric slab components have been formed. The actual sequencing will vary depending upon the particular process flow selected.

While various manufacturing approaches have been discussed above, piezoelectric slabs for establishing a desired stress profile may manufactured in a number of additional ways. In applications wherein the complexity of manufacturing steps is desired to be reduced, the approach depicted in FIGS. 16-19 may be used to obtain a layout substantially functionally equivalent to the device formed by the process depicted in FIGS. 13-15. In FIG. 16, blanket layers including a blanket layer of insulating material 380 which also functions as an etch stop, a blanket layer of bottom electrode material 382, a blanket layer of piezoelectric material 384, and a blanket layer of upper electrode material 386, are deposited on a base layer 388. A first photomask is then applied and the device is etched to reveal an electrode portion 390 of the bottom electrode layer 380 as depicted in FIG. 19.

Next, a second photomask is applied which protects the electrode portion 390 as well as the portions of the blanket layers that will finally form the conducting portions and piezoelectric slabs. The configuration of FIGS. 18 and 19 is then attained after a second etch down to the insulating layer 380. In FIGS. 18 and 19, the electrode portion 390 is exposed above the insulation layer 380. Additionally, piezoelectric slab portions 394, 396, and 398 formed from the blanket layers 382, 384, and 386 remain. Because a portion of the piezoelectric layer 384 is present in the piezoelectric slab portion 396, the stress applied by the device of FIG. 20 will be slightly different from the stress applied by the device of FIG. 15. The manufacturing complexity of the device of FIG. 20, however, is significantly less.

Additionally, while the above described processes include deposition of various layers of material onto a base layer and then definition of the components of the piezoelectric slab, in some embodiments definition of structure in the base layer is provided after the piezoelectric slab components have been formed. The actual sequencing will vary depending upon the particular process flow selected.

In addition to the size, number, and relative orientation of the piezoelectric slabs, the location of the slabs on the base layer may also be modified. Accordingly, piezoelectric slabs may be used on one or more of the sides, the end, or the upper and lower surfaces of a particular base layer. Consequently, a wide variety of desired stress profiles may be effected using piezoelectric slabs, either alone or in combination with conducting portions formed within a MEMS device. The stress profile can be used to adjust in-plane as well as out-of-plane positioning of a base layer, along with any structure attached to the base layer. Additionally, while the base layers in the embodiments above have been depicted as beams, the base layer in other embodiments may be another structural member such as membrane which is supported by one or more beams. In some embodiments, both the membrane and the support beams for the membrane may include piezoelectric slabs which allow for controlled deformation of the beams and the membranes.

The disclosed piezoelectric slabs thus allow for high-efficiency transduction compared to the electrostatic type devices. Thus, high linearity between input voltage and output stress can be achieved. As compared to capacitive comb drive designs, fabrication of piezoelectric slabs is easily incorporated into microfabrication processes and there is no need for a high actuation voltage. In contrast to capacitive parallel plate designs, piezoelectric slabs are not subject to non-linearity on travel distance or "pull-in" effects.

Accordingly, use of piezoelectric slabs to effect desired deformation of structures such as beams and membranes enables specific performance tuning of a MEMS device based upon the layout of the slabs as well as the adjustment or selection of voltage applied to the slabs. Moreover, the piezoelectric slabs described above may be integrated into a CMOS process if desired. Additionally, either with or without establishing a desired stress profile, the electrodes may be monitored for perturbations allowing the base layer with the piezoelectric slabs to be used as a sensor.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A MEMS device, comprising:
a continuous portion of a base layer;
a first piezoelectric layer portion operably connected to a surface of the continuous portion of the base layer;
a first conducting portion positioned adjacent to a first side of the first piezoelectric layer portion;
a second conducting portion positioned adjacent to a second side of the first piezoelectric layer portion, wherein the first side is opposite to the second side and the first and second conducting portions are positioned so as to apply a first electric field to the first piezoelectric slab;
a second piezoelectric layer portion operably connected to the surface of the continuous portion of the base layer at a location spaced apart from the first piezoelectric layer portion;
a third conducting portion positioned adjacent to a third side of the second piezoelectric layer portion;
a fourth conducting portion positioned adjacent to a fourth side of the second piezoelectric layer portion, wherein the third side of the second piezoelectric slab is opposite to the fourth side of the second piezoelectric layer portion and the third and fourth conducting portions are positioned so as to apply a second electric field to the second piezoelectric layer portion; and
a voltage source operably connected to the first, second, third and fourth conducting portions and configured to apply a desired potential across the first and the second conducting portions, and across the third and fourth conducting portions, such that the first piezoelectric layer portion and the second piezoelectric layer portion cause the continuous portion of the base layer to deform based upon a desired deformation.

2. The device of claim 1, wherein:
applying the first electric field to the first piezoelectric layer portion causes a compressive force to be applied by the first piezoelectric layer portion on the continuous portion of the base layer; and
applying the second electric field to the second piezoelectric layer portion causes a tensile force to be applied by the second piezoelectric layer portion on the continuous portion of the base layer.

3. The device of claim 2, wherein:
the first conducting portion is in electrically conductive communication with the third conducting portion;
the first conducting portion is located between the first piezoelectric layer portion and the continuous portion of the base layer; and
the fourth conducting portion is located between the second piezoelectric layer portion and the continuous portion of the base layer.

4. The device of claim 3, further comprising:
a third piezoelectric layer portion operably connected to the surface of the continuous portion of the base layer and axially aligned with the first piezoelectric layer portion;
a fifth conducting portion positioned adjacent to a fifth side of the third piezoelectric layer portion; and
a sixth conducting portion positioned adjacent to a sixth side of the third piezoelectric layer portion, wherein
the fifth side is opposite to the sixth side and the fifth and sixth conducting portions are positioned so as to apply a third electric field to the third piezoelectric slab,
the first conducting portion is in electrically conductive communication with the sixth conducting portion, and
the fifth conducting portion is located between the third piezoelectric layer portion and the continuous portion of the base layer.

5. A MEMS device comprising:
a continuous base layer portion extending outwardly from a base portion;
a first piezoelectric layer portion operably connected to a surface of the continuous base layer portion;
a first conducting portion positioned adjacent to a first side of the first piezoelectric layer portion and between the first piezoelectric layer portion and the continuous base layer portion;
a second conducting portion positioned adjacent to a second side of the first piezoelectric layer portion;
a second piezoelectric layer portion spaced apart from the first piezoelectric layer portion and operably connected to the surface of the continuous base layer portion;
a third conducting portion in electrical communication with the second conducting portion and positioned adjacent to a third side of the second piezoelectric layer portion and between the second piezoelectric layer portion and the continuous base layer portion; and
a fourth conducting portion positioned adjacent to a fourth side of the second piezoelectric layer portion.

6. The MEMS device of claim 5, wherein the first piezoelectric layer portion defines a first longitudinal axis;

the second piezoelectric layer portion defines a second longitudinal axis; and the first longitudinal axis is substantially aligned with the second longitudinal axis.

7. The MEMS device of claim 6, further comprising:

a third piezoelectric layer portion spaced apart from the first piezoelectric layer portion and the second piezoelectric layer portion, and operably connected to the surface of the continuous base layer portion;

a fifth conducting portion in electrical communication with the second conducting portion and positioned adjacent to a fifth side of the third piezoelectric layer portion and between the third piezoelectric layer portion and the continuous base layer portion; and a sixth conducting portion positioned adjacent to a sixth side of the third piezoelectric layer portion, wherein the third piezoelectric layer portion defines a third longitudinal axis, and the third longitudinal axis is offset to and parallel with the first longitudinal axis.

8. The MEMS device of claim 6, further comprising:

a sensor operably connected to the first conducting portion and the second conducting portion.

9. The MEMS device of claim 6, further comprising:

a voltage source operably connected to the first conducting portion and the second conducting portion.

10. The MEMS device of claim 6, further comprising:

a charge sensor configured such that deformation of the continuous base layer portion results in a change in an output signal of the charge sensor.

* * * * *